United States Patent
Pahl et al.

(10) Patent No.: US 9,035,189 B2
(45) Date of Patent: May 19, 2015

(54) CIRCUIT BOARD WITH FLEXIBLE REGION AND METHOD FOR PRODUCTION THEREOF

(75) Inventors: Wolfgang Pahl, Munich (DE); Hans Krueger, Munich (DE); Peter Demmer, Munich (DE)

(73) Assignee: EPCOS AC, Munich (DE)

( * ) Notice: Subject to any disclaimer, the term of this patent is extended or adjusted under 35 U.S.C. 154(b) by 1041 days.

(21) Appl. No.: 12/997,867

(22) PCT Filed: Jun. 8, 2009

(86) PCT No.: PCT/EP2009/057051
§ 371 (c)(1),
(2), (4) Date: May 26, 2011

(87) PCT Pub. No.: WO2009/150133
PCT Pub. Date: Dec. 17, 2009

(65) Prior Publication Data
US 2011/0214905 A1    Sep. 8, 2011

(30) Foreign Application Priority Data
Jun. 13, 2008    (DE) .......................... 10 2008 028 300

(51) Int. Cl.
*H05K 1/00* (2006.01)
*H05K 1/18* (2006.01)
*H05K 3/46* (2006.01)

(52) U.S. Cl.
CPC .............. *H05K 1/189* (2013.01); *H05K 3/4691* (2013.01); *H05K 2201/0394* (2013.01); *H05K 2201/09081* (2013.01); *H05K 2201/09109* (2013.01); *H05K 2203/308* (2013.01); *H01L 2224/16225* (2013.01)

(58) Field of Classification Search
USPC ................. 174/254, 261, 377, 528; 361/800; 257/202, 212, 700, 737; 428/137; 439/607.01; 349/149
See application file for complete search history.

(56) References Cited

U.S. PATENT DOCUMENTS

| | | | | |
|---|---|---|---|---|
| 4,359,726 A | * | 11/1982 | Lewiner et al. | 340/666 |
| RE32,180 E | * | 6/1986 | Lewiner et al. | 340/573.1 |
| 4,735,847 A | * | 4/1988 | Fujiwara et al. | 428/209 |
| 5,103,375 A | * | 4/1992 | Cottingham et al. | 361/715 |
| 5,159,751 A | * | 11/1992 | Cottingham et al. | 29/832 |
| 5,204,806 A | * | 4/1993 | Sasaki et al. | 361/749 |
| 5,266,746 A | * | 11/1993 | Nishihara et al. | 174/254 |
| 5,428,190 A | * | 6/1995 | Stopperan | 174/261 |
| 5,509,823 A | * | 4/1996 | Harting et al. | 439/607.17 |
| 5,528,403 A | * | 6/1996 | Kawaguchi et al. | 349/149 |
| 6,195,261 B1 | * | 2/2001 | Babutzka et al. | 361/752 |
| 6,259,035 B1 | * | 7/2001 | Truggelmann et al. | 174/250 |
| 6,882,538 B1 | * | 4/2005 | Frisch | 361/728 |
| 6,931,935 B2 | * | 8/2005 | Blomberg | 73/718 |
| 7,449,773 B2 | * | 11/2008 | Tarn | 257/700 |

(Continued)

FOREIGN PATENT DOCUMENTS

| | | |
|---|---|---|
| DE | 197 20 106 | 11/1998 |
| DE | 10 2004 028 211 | 12/2005 |

(Continued)

*Primary Examiner* — Xiaoliang Chen
(74) *Attorney, Agent, or Firm* — Cozen O'Connor (57) ABSTRACT

A circuit board comprising a circuit carrier, a cover layer composed of a nonconductive material, comprising an organic substance, arranged on the circuit carrier, a first metallization layer at least partly arranged on the cover layer, wherein the first metallization layer has a flexible region.

22 Claims, 7 Drawing Sheets

(56) References Cited

U.S. PATENT DOCUMENTS

| | | | |
|---|---|---|---|
| 7,579,679 B2* | 8/2009 | Puschner et al. | 257/679 |
| 7,580,103 B2* | 8/2009 | Kawaguchi | 349/150 |
| 2004/0070959 A1* | 4/2004 | Sakai | 361/792 |
| 2004/0118595 A1* | 6/2004 | Flammer et al. | 174/254 |
| 2004/0145874 A1 | 7/2004 | Pinel et al. | |
| 2004/0231872 A1* | 11/2004 | Arnold et al. | 174/35 R |
| 2004/0240191 A1* | 12/2004 | Arnold et al. | 361/800 |
| 2004/0244191 A1 | 12/2004 | Orr et al. | |
| 2005/0110049 A1* | 5/2005 | Urushido | 257/202 |
| 2005/0200236 A1* | 9/2005 | Buhler et al. | 310/317 |
| 2006/0001156 A1* | 1/2006 | Wakiyama et al. | 257/737 |
| 2006/0017069 A1* | 1/2006 | Bergmann et al. | 257/212 |
| 2006/0040091 A1* | 2/2006 | Bletsos et al. | 428/137 |
| 2006/0068613 A1* | 3/2006 | Tsukada et al. | 439/67 |
| 2006/0097364 A1* | 5/2006 | Shinojima | 257/666 |
| 2006/0134982 A1* | 6/2006 | Zarganis et al. | 439/607 |
| 2006/0163727 A1* | 7/2006 | Hedler et al. | 257/738 |
| 2006/0192465 A1* | 8/2006 | Kornbluh et al. | 310/800 |
| 2007/0047149 A1* | 3/2007 | Motonishi | 360/245.9 |
| 2008/0137317 A1 | 6/2008 | Worl et al. | |
| 2008/0289859 A1* | 11/2008 | Mikado et al. | 174/254 |
| 2009/0166859 A1* | 7/2009 | Yuan et al. | 257/737 |

FOREIGN PATENT DOCUMENTS

| | | |
|---|---|---|
| JP | 58-153468 | 10/1983 |
| JP | 62-068265 | 4/1987 |
| JP | 09 331153 | 12/1997 |
| JP | 2004-140018 | 5/2004 |
| JP | 2006-216436 | 8/2006 |
| JP | 2006-231174 | 9/2006 |
| JP | 2006-342238 | 12/2006 |
| WO | WO 2004/030429 | 4/2004 |

* cited by examiner

CIRCUIT BOARD WITH FLEXIBLE REGION AND METHOD FOR PRODUCTION THEREOF

RELATED APPLICATIONS

This is a U.S. national stage of application No. PCT/EP2009/057051, filed on Jun. 8, 2009.

This application claims the priority of German application no. 10 2008 028 300.2 filed Jun. 8, 2009, the entire content of which is hereby incorporated by reference.

FIELD OF THE INVENTION

The present invention is related to circuit board with a flexible region.

BACKGROUND OF THE INVENTION

A widespread problem in the production of inherently rigid circuit boards is that of realizing flexible regions without impairing the robustness or compactness of the circuit board overall.

SUMMARY OF THE INVENTION

One object of embodiments of the invention is providing an inherently rigid circuit board which has a flexible region. In addition, the circuit board shall be realizable simply and cost-effectively with only slightly modified standard processes for the production of rigid circuit boards.

One embodiment of the invention relates to a circuit board comprising a circuit carrier, a cover layer composed of a nonconductive material, which comprises an organic substance and is arranged on the circuit carrier, a first metallization layer arranged on the cover layer, wherein the first metallization layer has a flexible region.

In connection with this invention, flexible should be understood to mean that, in the event of a force action perpendicular to the circuit board, the surface is deflected at least 10-fold compared with the non-flexible regions of the circuit board. This condition should be met at least for tensile forces, but advantageously for tensile and compressive forces. Embodiments in which the flexible region is appreciably bent out of the circuit board plane are intended to meet the condition prior to bending-out.

In this case, the flexible region can be restricted to a part of the circuit board which is very small relative to the total area of the circuit board. By way of example, flexible connections can be realized by means of the flexible region, without impairing the robustness or compactness of the circuit board overall. The material for the cover layer can, for example, comprise a resin as organic substance.

In a further embodiment, the cover layer is also flexible in addition to the first metallization layer in the flexible region.

This has the advantage that the first metallization layer can be mechanically stabilized by the cover layer. This enables embodiments in which the first metallization layer is shaped very thinly in terms of the layer thickness. It can then be so thin that it would be mechanically unstable by itself and the layer thickness is limited in terms of its minimum thickness only by the function as an electrical conductor. In this case, the geometry of the first metallization layer is no longer determined by a supporting function, but rather can be determined for example only by the electrically conductive function. The small thickness of the metallization layer enables embodiments in which the flexible region has a very high flexibility.

For the cover layer, a material can be used which does not restrict the flexibility of the first metallization layer and, nevertheless, contributes to the sufficient stability of the first metallization layer.

In a further embodiment, the flexible region has at least one axis along which said flexible region can bend away relative to the rest of the circuit board. Embodiments are possible in which the flexible region can move about said axis both toward the rest of the circuit board and away from the latter.

This enables the flexible region to be able to be bent about said axis both into the circuit board and out of the plane thereof. For the rotation about the axis out of the plane of the circuit board, a rotation by 180°, for example, is also possible. Consequently, the flexible region would bear with its former top side again on the cover layer or the metallization, or run with a certain interspace with respect to the cover layer again parallel to the cover layer. However, angles of greater than 180° are also conceivable, for example, in the case that the rotation axis is situated at the edge of the cover layer or in the vicinity of the edge of the cover layer. Thereby, it would be conceivable, for example, for the flexible region to be bent about the axis by 270°, such that it is then situated perpendicularly at the outer edge of the circuit board downward. Embodiments are also possible in which a movement of the flexible region occurs or is performed only during operation of the circuit boards.

In a further embodiment, the flexible region is connected to its surroundings or the rest of the circuit board at only one side. The flexible region can then be shaped as a tongue, for example.

This imparts a very high flexibility to the flexible region. The side at which the flexible region is connected to the surroundings can additionally also have cutouts. The latter can proceed from the outer edges of the flexible region and extend into the latter, such that corners are formed. However, they can also be cutouts which do not run as far as the outer edge, such as, for example, holes or slots in the flexible region. The flexibility of the flexible region is once again increased by the cutouts.

In a further embodiment, the flexible region is arranged above a free space. In connection with this invention, free space should be understood to mean that the flexible region has no mechanical or chemical bond to the plane running below it. The free space can therefore be shaped for example as a cavity into which the flexible region can move. However, free space should also be understood to mean that below the flexible region there follows directly a plane or layer to which the underside of the flexible region is not connected, or does not adhere on it. The flexible region therefore has the possibility, even without a cavity being situated below it, of being able to move out of the conductor plane. In this embodiment, materials having little tendency toward adhesion are particularly suitable for the layer below the flexible region. By way of example, a material comprising fluorinated polymers can be used.

In one embodiment, the first metallization layer on the cover layer, in partial regions of the flexible region, is shaped as a conductive track and/or contact area.

In this embodiment, the first metallization layer can be restricted to a small partial region of the flexible region. In this case, the first metallization layer performs the function of current conduction and/or electrical contact-making. The contact area can serve, for example, for making electrical contact with an electronic component which is placed or mounted onto the circuit boards. Embodiments are conceivable in which, prior to the mounting of the electronic component, the flexible region is first bent out of the plane of the circuit board before the electronic component is placed onto the contact area. Embodiments are likewise also conceivable in which, as a result of the placement of the electronic component, the flexible regions are pressed into the cavity situated below them. Furthermore, embodiments are conceivable in which, after the mounting of the electronic component, the flexible regions are still situated in their initial position parallel to the circuit board, but their flexibility enables a certain mobility for the placed electronic component.

In a further embodiment, the flexible region has cutouts, which increase the flexibility of the flexible region.

Said cutouts can lead into the flexible region both from the free edges and from the side by which the flexible region is connected to the surroundings. Cutouts are likewise also conceivable which start neither from a free side nor from the linked side of the flexible region, but rather are present as holes having different geometries in the flexible region. In this case, embodiments are conceivable in which the cover layer in the flexible region is reduced in thickness or even removed to an extent such that it is present only in the partial regions where it is coated with the first metallization layer.

In a further embodiment, the cover layer comprises a stabilizing fabric.

Said fabric can consist, for example, of individual free fibers but also of a mat. The material can be a fibrous fabric, for example. The cover layer can have other reinforcing elements alongside the stabilizing fabric or else instead of the latter. Said reinforcing elements can both be incorporated into the layer itself and be situated on the surface of the cover layer. The reinforcing elements can impart an additional stiffness to the cover layer. During the application of the reinforcing elements, the region of the axis about which the flexible region can move can be omitted, or the reinforcing elements can be destroyed again in the region of the axis in a further method step.

In a further embodiment, an electronic component is arranged on the flexible region, said electronic component being electrically conductively connected to the first metallization layer.

For the case where the electronic component is connected to the circuit board only via one or a plurality of flexible regions, the entire electronic component has a certain flexibility relative to the circuit board. Said flexibility can exist not only toward the circuit board or away from the latter, but in all three spatial directions. A circuit board can also have more than only one flexible region. On a circuit board, it is also possible for more than one component to be arranged on one or a plurality of flexible regions.

In a further embodiment, the flexibility with respect to tensile stress of the flexible region in the direction of the circuit board plane is increased by cutouts.

In a further embodiment, a cap is placed on the circuit board in such a way that an enclosed volume for housing a component is formed at least in partial regions. In this case, the cap can cover only a part of the circuit board, but also the entire circuit board. In this case, the flexible region can be situated in or else outside the cap.

The circuit board can be used as an interposer, for example. In this case, it can be arranged between a conventional circuit carrier, not according to the invention, and a stress-sensitive component placed on the circuit board preferably in the flexible region.

In a further embodiment, it is possible to use a circuit board having a coefficient of linear thermal expansion with respect to the circuit board plane which is at least 4 ppm/K greater than that of the electronic component mounted on the circuit board. Thus, by way of example, the coefficient of linear thermal expansion of the circuit board can be greater than 12 ppm/K, and that of the electronic component mounted on the circuit board can be less than 8 ppm/K. In this case, the flexible region prevents an impermissibly high thermal stress loading of the component.

In addition to the circuit board itself, methods for producing the circuit board are also claimed.

One method variant for producing a circuit board comprises the following method steps: providing a circuit carrier, applying a delamination layer to a spatially delimited partial region of the circuit carrier, applying a layer sequence to the delamination layer and a partial region of the circuit carrier, comprising a cover layer, comprising an organic material, and a first metallization layer on the cover layer, and structuring the cover layer and the first metallization layer, wherein a flexible region of the first metallization layer is defined.

As a result of structuring the cover layer and the first metallization layer in the region of the cover layer, a partial region of the cover layer is at least partially detached from the rest of the cover layer. That means that a part of the cover layer is structured out by means of cutting, milling or etching or other process techniques, for example, said part now no longer being connected to the surrounding cover layer toward all sides and thus having an increased flexibility relative to the surrounding cover layer. With the cover layer, the first metallization layer arranged on the cover layer also has this flexibility. The flexible region defined in this way can now be bent out of the plane of the cover layer in a further method step, for example.

In a further variant of this method, the delamination layer is removed for forming the flexible region in a further method step. As a result of removing the delamination layer, it is possible to produce a cavity below the flexible region. Said cavity enables the flexible region to move not only out of the plane of the circuit board but also into the plane. The delamination layer can be applied and structured as a sacrificial layer.

The sacrificial layer can be selected from soluble layers, selectively etchable layers, volatile or decomposable layers, evaporable layers and layers having a low melting point. This enables the sacrificial layer to be able to be removed on the circuit board without the adjoining layers being detrimentally affected. The method of the sacrificial layer makes it possible firstly to produce very large free spaces and secondly to generate very thin layers, which are flexible for that reason already, above the sacrificial layer. In further subsequent method steps, the thin layers, after their application on the sacrificial layer, can be stabilized and cured in such a way that they have a sufficient stability after the removal of the sacrificial layer. This can be done for example by a plurality of further thin layers being produced or applied one above another.

In a further method variant, which is independent of the first method variant, the circuit board can be produced by a production method comprising the following method steps: providing a circuit carrier, working a recess in the circuit carrier, applying a layer sequence to the circuit carrier, such that the recess is covered but not filled, as a result of which a free space is formed, wherein the layer sequence comprises a cover layer, comprising an organic material, and a first metallization layer on the cover layer, structuring the cover layer and the first metallization layer above the free space, such that a flexible region of the first metallization layer is formed.

This method variant has the advantage over the first method variant described that no delamination layer is necessary in this case.

BRIEF DESCRIPTION OF THE INVENTION

Variants of the invention will be explained in greater detail below on the basis of exemplary embodiments and with reference to figures.

In the figures.

DETAILED DESCRIPTION OF THE DRAWINGS

Figure 1A:
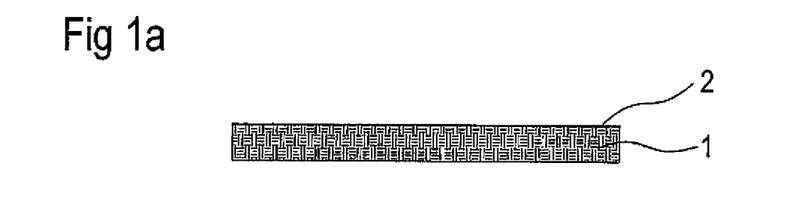
FIGS. 1a to 1i schematically show the method step sequence of one method variant.

The sequence of FIGS. 1a to 1i schematically shows steps of one possible production variant. FIG. 1a illustrates the circuit carrier 1. A second metallization layer 2 is arranged on the circuit carrier 1. For reasons of clarity, the illustration of plated-through holes or external connections on the top side and/or underside of the circuit carrier has been omitted. By way of example, a glass-fiber-reinforced epoxide substrate can be used for the circuit carrier 1. By way of example, a copper film can be used for the second metallization layer. The copper film can be laminated onto the circuit carrier 1, for example. The second metallization layer 2 can already be structured prior to being applied to the circuit carrier 1 or can also be structured after being applied to the circuit carrier.

Figure 1B:
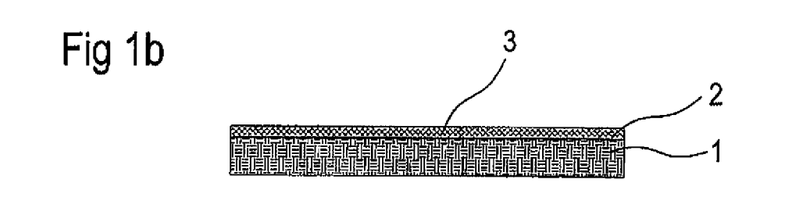

FIG. 1b shows the layer sequence comprising the circuit carrier 1, the second metallization layer 2 and the delamination layer 3. This layer sequence can emerge from the layer sequence illustrated in FIG. 1a for example by virtue of the fact that the delamination layer 3 was applied to the second metallization layer 2. In FIG. 1b, the delamination layer 3 still covers the entire second metallization layer 2. By way of example, a negative photoresist, a positive photoresist, or alternatively laminatable dry resists can be used for the delamination layer.

A preferred thickness for the delamination layer 3 is in the range of 1 to 50 μm.

The material for the delamination layer 3 can be chosen such that it can be removed again in a further subsequent method step. By way of example, the following techniques are appropriate for the removal: dissolving out, etching out, treatment with plasma, treatment with increased temperatures, evaporation, sublimation, decomposition, swelling or foaming. For the case where soluble resists are used, preference is given to such resists which dissolve very well instead of dispersing or crumbling into coarse particles or flakes. This simplifies the removal of the material of the delamination layer 3 in a manner free of residues.

Polymers which can be decomposed thermally with few residues or with no residues are also suitable, in particular, besides resists. Materials which can be removed using aqueous solvents are polyvinyl alcohol or polyvinylpyrrolidone, for example. The temperature range for the thermal decomposition is preferably in the range of 180 to 260° C. By way of example, cellulose derivatives such as methylcellulose, carboxymethylcellulose, hydroxypropylcellulose, cellulose acetate and cellulose esters are suitable as thermally decomposable material. However, the cellulose derivatives can also be removed by means of solvents. Materials having melting points in the range of 150 to 220° C. are also particularly well suited. By way of example, hexachloroethane should be mentioned here, the melting point of which is 186° C., but which already has a high sublimation rate at 185° C. A further possible material which can be used for the delamination layer 3 is Unity 2000P® Sacrificial Polymer from Promeros LLC, Ohio.

Figure 1C:
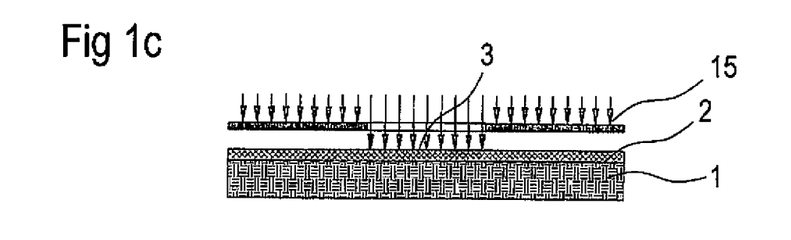

FIG. 1c schematically illustrates an exposure method by which the delamination layer 3 is intended to be structured. For this purpose, a mask 15 is fitted above the delamination layer 3, as a result of which the radiation, which is illustrated schematically by the arrows, impinges on only a partial region of the delamination layer 3. Other structuring methods are also conceivable for structuring the delamination layer 3. By way of example, a scanning direct exposure is also possible, such as can be carried out using a laser, for example.

Figure 1D:
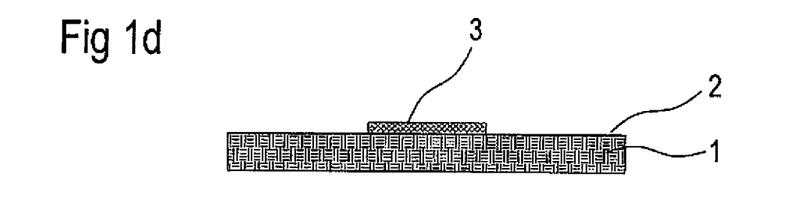

FIG. 1d schematically shows the side view of the circuit carrier, which now has a structured delamination layer 3. The delamination layer 3 now only covers a partial region of the second metallization layer 2. It is possible to arrive at the circuit board illustrated in FIG. 1d not only by means of the subtractive method illustrated in FIGS. 1b and 1c, but also alternatively by means of additive methods. By way of example, the screen or stencil printing method or else application method by means of inkjet should be mentioned here. Substances that are not sensitive to light can also be used for the additive methods.

Figure 1E:
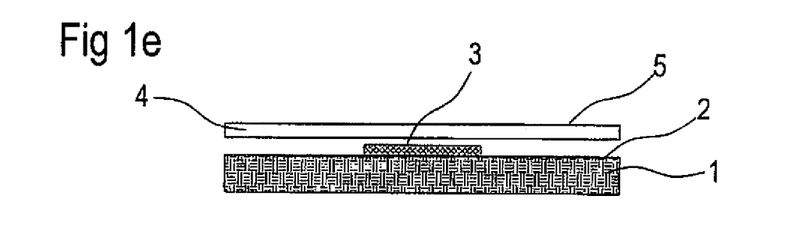

In FIG. 1e, on the circuit board illustrated in FIG. 1d, a cover layer 4 is then applied above the free partial regions of the second metallization layer 2 and above the delamination layer 3. A first metallization layer 5 is situated on the cover layer 4. Application can be effected by means of lamination, for example. The layer sequence of cover layer 4 and first metallization layer 5 can also be applied in two separate method steps. For this purpose, the cover layer 4, which comprises an organic material, can be applied for example by casting, spin-coating or lamination. In a second, subsequent method step, the first metallization layer 5 can then be applied to the cover layer 4. If the layer sequence of cover layer 4 and first metallization layer 5 is intended to be applied in one method step, then for this purpose it is possible to use, for example, a glass-fiber-reinforced epoxide base material having a metallization on one side, which metallization can be a thin copper film, for example. The first metallization layer 5 preferably has a thickness in the range of 3 to 20 μm. The cover layer 4 preferably has a thickness in the range of 5 to 100 μm. By way of example, a resin-like material can also be used for the cover layer 4, which material can also be provided with further reinforcing elements in or after the application process. By way of example, a polyimide-based material is also suitable for the cover layer 4, which material can additionally have a copper coating.

Figure 1F:
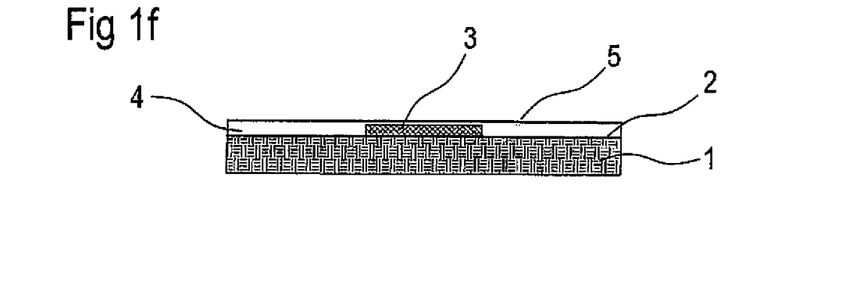

FIG. 1f illustrates a circuit board to which the cover layer 4 and the first metallization layer 5 have now been applied. It can be seen that the cover layer 4 has a significantly smaller thickness above the delamination layer 3 than in the partial regions where it bears on the second metallization layer 2. Embodiments are also conceivable in which no cover layer 4 is applied above the delamination layer 3, but the first metallization layer 5 is arranged directly on the delamination layer 3. After the lamination or pressing of the cover layer 4, a further step of curing of the cover layer can also ensue.

Figure 1G:
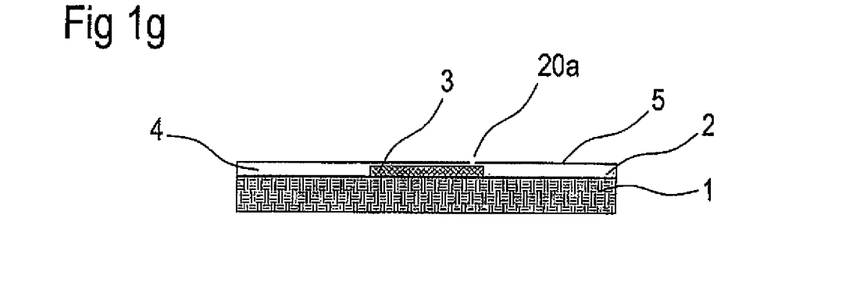

FIG. 1g illustrates a circuit board in which a small partial region of the first metallization layer 5 has been removed. The removal has formed a small opening 20a in the first metallization layer 5, which is arranged above the delamination layer 3. The removal of the partial region of the first metallization layer 5 can be effected for example by means of a photopatterning step and a subsequent etching step.

Figure 1H:
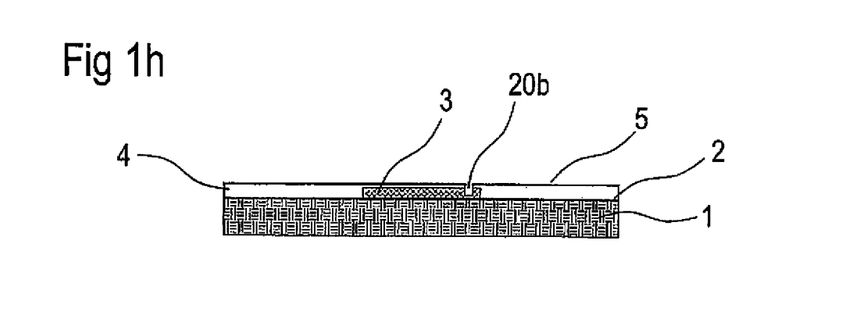

FIG. 1h illustrates a circuit board in which the cover layer 4 lying below the opening 20a has been removed, such that a trench 20b has been produced. The trench 20b can, as illustrated in FIG. 1h, also extend into the delamination layer 3. For the production of the trench 20b it is possible to use an etching method, for example, such as a plasma etching method, for example. For the etching method, the first metallization layer 5 can serve as a mask. A laser can also be used for producing the trench. The method steps illustrated in FIG. 1g and in FIG. 1h can also be carried out in a common method step.

Figure 1I:
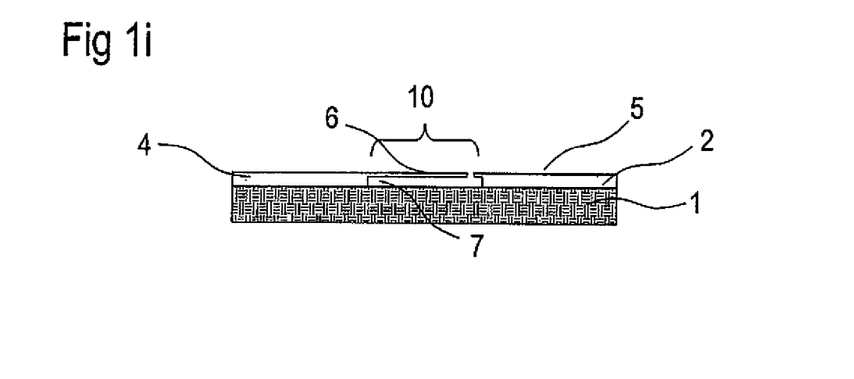

FIG. 1i illustrates a circuit board in which the delamination layer 3 has been removed, such that a free space 7 has been produced. The delamination layer 3 can be removed for example by being dissolved out or etched out or by a thermal method. In this case, the material of the delamination layer 3 can be swollen, foamed or decomposed, depending on the technique used. The flexible region 10 has been formed as a result of the removal of the delamination layer 3. In this exemplary embodiment, the cover layer 4 and the second metallization layer 2 are shaped as a tongue 6 in the flexible region 10. The circuit carrier 1 below the free space 7 is rigid, that is to say not flexible.

Figure 2:
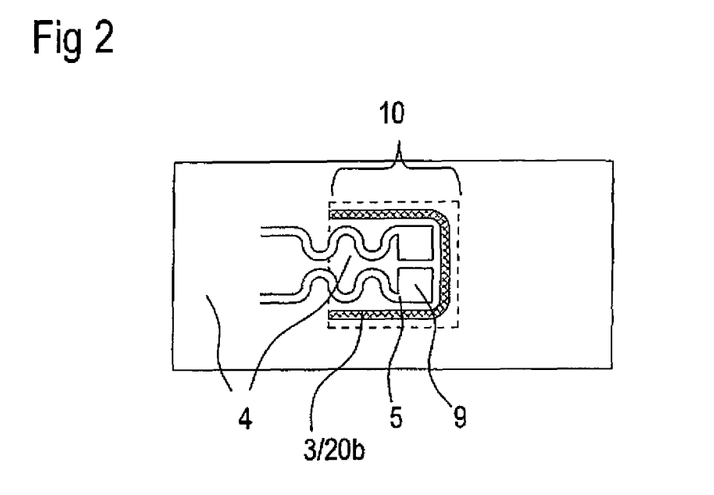
FIG. 2 shows the plan view of one exemplary embodiment.

FIG. 2 shows a plan view of a circuit board. This circuit board could be, for example, one such as is illustrated in FIG. 1i. The illustration shows the cover layer 4, on which the first metallization layer 5 is applied. The cover layer 4 and the first metallization layer 5 comprise a flexible region 10. The flexible region 10 is delimited by the trench 20b on three sides in a u-shaped manner. Through the trench 20b the illustration reveals the underlying delamination layer 3, which, as stated, can also be removed through said trench 20b. Here, the first metallization layer 5 is shaped as a pair of conductor tracks each ending in a contact area 9. After the removal of the delamination layer 3, the flexibility of the region within the trench 20b is once again significantly increased. Consequently, the two contact areas 9 at the end of the first metallization layer 5 are also flexible. In this exemplary embodiment, the mechanical properties of the flexible region 10 are determined predominantly by the structure of the first metallization layer 5 and the thickness thereof. A further flexibilization particularly with respect to tensile and shear stresses in the plane can be obtained by corresponding shaping of the conductor tracks of the first metallization layer 5, as are illustrated in FIG. 2.

Figure 3:
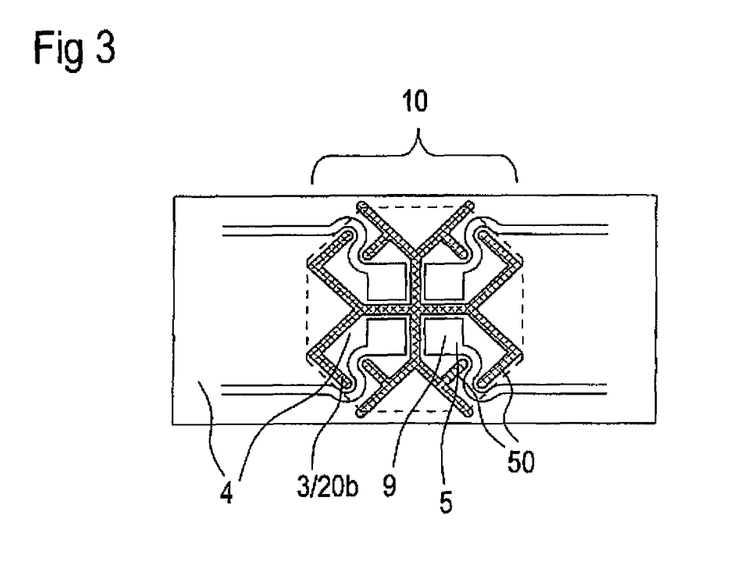
FIG. 3 shows the plan view of a further embodiment.

A further embodiment of the circuit board is illustrated as a plan view in FIG. 3. Besides the elements such as can be seen in FIG. 2, the embodiment in FIG. 3 additionally also comprises cutouts 50. While the trench 20b in FIG. 2 surrounds the flexible region 10, it also serves to enable the delamination layer 3 to be dissolved out. The cutouts in FIG. 3 additionally also have the function of increasing the flexibility of the flexible region 10. In order to facilitate the mounting of an electronic component on the circuit board, the connections of the component to the circuit board are carried out for example by means of bonding wires, soldered joints or thermosonic flip-chip connections preferably prior to the removal of the delamination layer 3 since the latter, as long as it is still present, stabilizes the flexible region 10.

Figure 4:
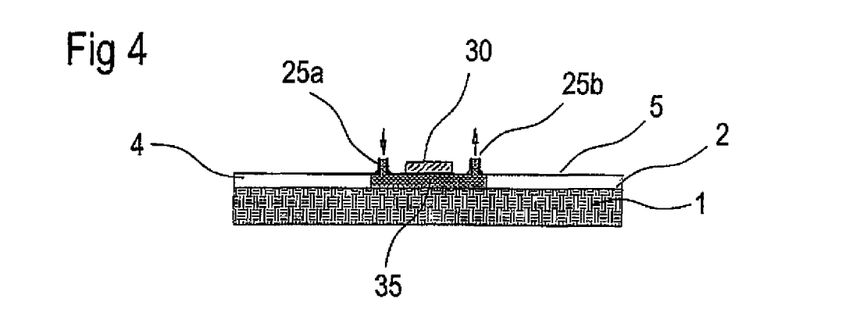
FIG. 4 shows the schematic side view of one possible particular embodiment.

FIG. 4 shows one particular embodiment of the circuit board. The embodiment comprises a circuit carrier 1, a second metallization layer 2, a cover layer 4, and a first metallization layer 5. In this embodiment, a cover layer 4 is no longer present in the flexible region 10. Consequently, the flexible region 10 only comprises the first metallization layer 5. In this embodiment, the free space 7 is shaped as a channel 35. The channel 35 can be filled with liquids or gases via the inlet 25a, which can leave the channel 35 again via the outlet 25b. Above the channel 35, an electronic component 30 is arranged on the first metallization layer 5. The channel 35 can be used for example for cooling the electronic component 30. Since the first metallization layer 5 consists of metal, it can pass on well for example the heat from the electronic component 30 to, for example, a cooling liquid flowing through the channel 35.

Figure 5:
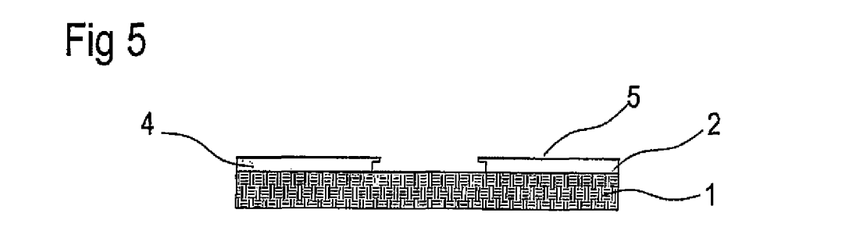
FIG. 5 shows the schematic side view of a further particular embodiment.

FIG. 5 illustrates an embodiment of the circuit board in which the flexible region 10 is restricted to an edge region running around the free space 7.

Figure 6:
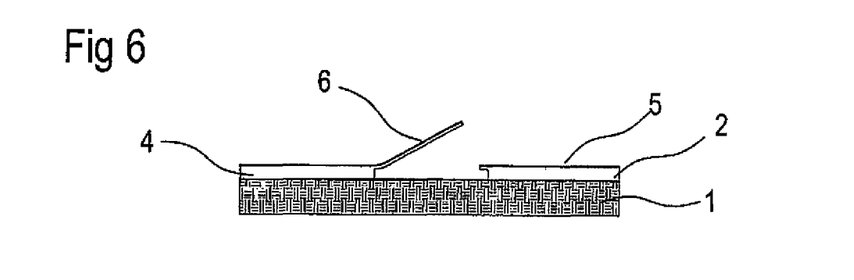
FIG. 6 shows a schematic side view of one possible further embodiment.

FIG. 6 shows an embodiment of a circuit board such as could emerge from the circuit board illustrated in FIG. 1i. For this purpose, in a further method step, the tongue 6 corresponding to the flexible region was bent out of the plane of the cover layer 4. The flexibility of the tongue 6 can be improved prior to the bending-out by the implementation of cutouts 50 (see FIG. 3). Furthermore, the still thin residue of the cover layer 4 can also be removed in the region of the bending axis.

Figure 7:
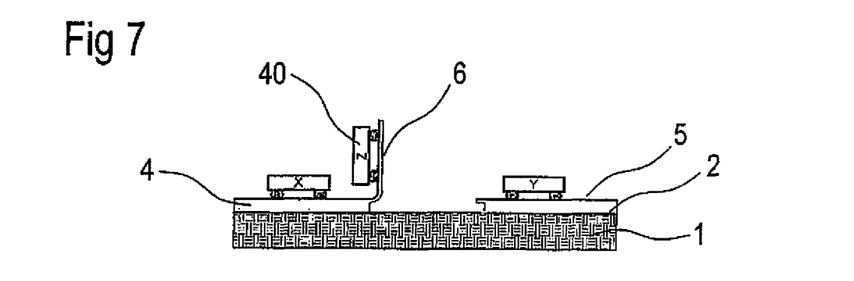
FIG. 7 shows a schematic side view of one possible further embodiment with additional elements.

FIG. 7 shows an embodiment in which the tongue 6 is bent out of the plane of the cover layer 4 to an extent such that it is now perpendicular to the cover layer 4. That now enables elements 40 directed in all three spatial directions (x, y, z) to be able to be arranged on the circuit board. In this case, the element 40z can be mounted as early as before the removal of the delamination layer 3 or the bending-out of the tongue 6. The process-technological challenges that would be necessary to actually fit such an element to a component that has already been shaped in the z-dimension are thus obviated. The elements 40 can be, for example, direction-dependent sensors, indicators or actuators. The arrangement illustrated then makes it possible, for example, to detect movement in all three spatial directions.

Figure 8A:
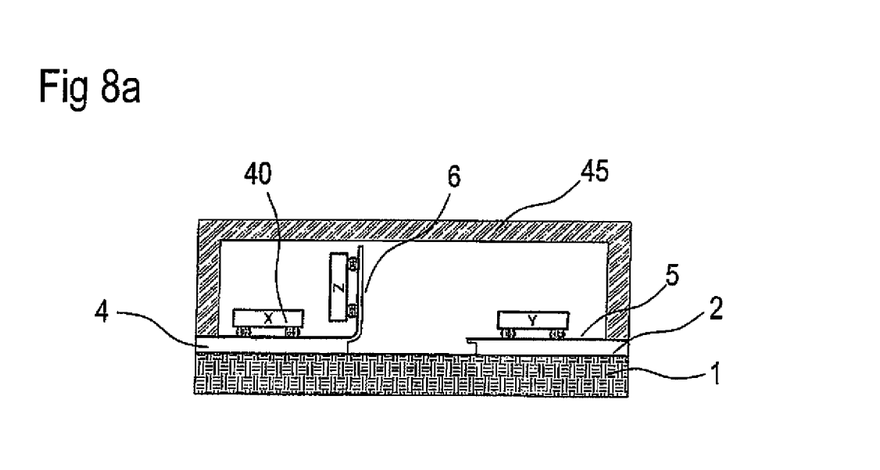
FIGS. 8a and 8b show further embodiments, which additionally also have a cap.
Figure 8B:
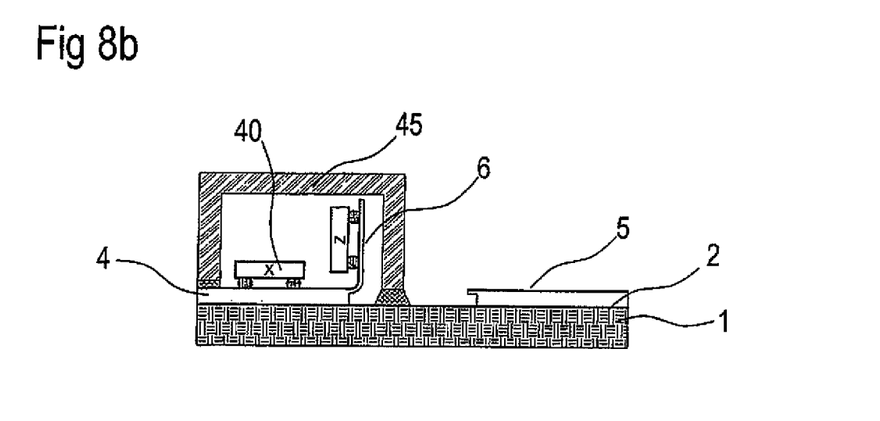

FIGS. 8a and 8b illustrate two embodiments of the circuit board which additionally also comprise a cap 45 in each case. FIG. 8a illustrates the component from FIG. 7, which additionally also completely encloses all three elements 40 by means of the cap 45. FIG. 8b shows a further embodiment, which has only two elements 40 enclosed by a cap 45, which only encloses a partial region of the circuit board.

Figure 9:
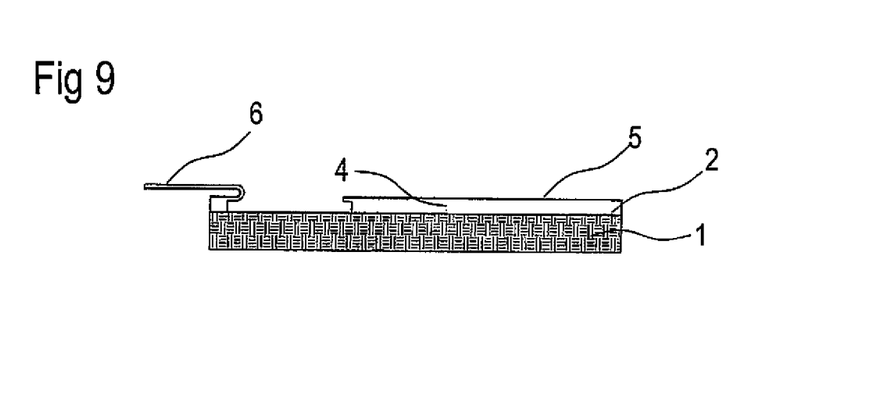
FIG. 9 shows a schematic side view of one possible further embodiment, FIGS. 10a to 10c schematically show the method steps of a further production method, FIGS. 11a to 11d schematically show intermediate stages in a production process in plan view.

FIG. 9 shows an exemplary embodiment of the circuit board in which the tongue 6 has been bent from its original position by 180°. As a result of this, the tongue 6 extends beyond the outer edge of the circuit board. As a result of this, the tongue 6 can now be utilized for example as external connection e.g. for electrical interconnection. Thus, by way of example, connections to other circuit boards can be produced in a simple manner. Furthermore, the tongue 6 can also be utilized as a heating film, antenna, capacitive or inductive transmitter/receiver.

Figure 10A:
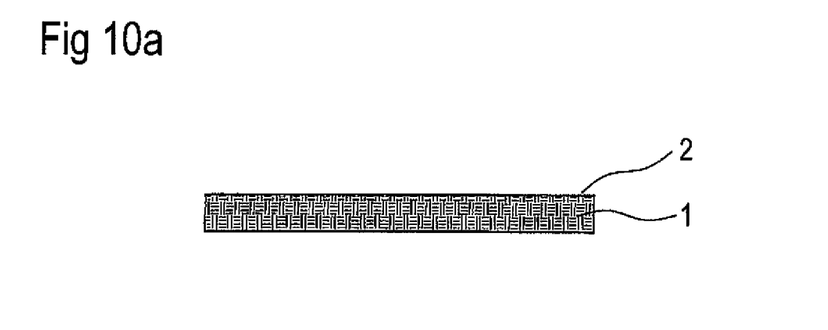
Figure 10B:
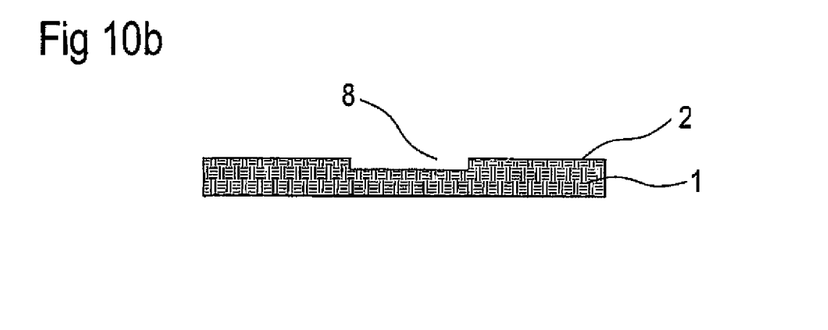
Figure 10C:
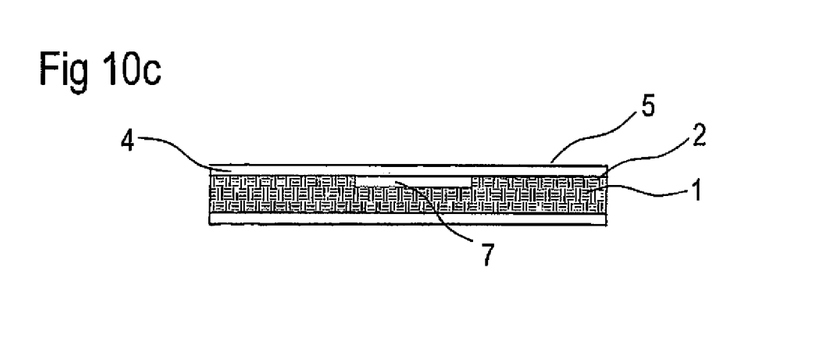

FIGS. 10a to 10c illustrate a further variant of a production method. FIG. 10a shows a circuit carrier 1 and a second metallization layer 2 arranged thereon. FIG. 10b illustrates a circuit board having a recess 8. This circuit board could be produced from the circuit board as illustrated in FIG. 10a, for example, by means of milling out or etching the recess 8. However, the recess 8 can also be produced with the aid of a laser technique, for example. The circuit board illustrated in FIG. 1c now additionally also has a cover layer 4 with a first metallization layer 5. By virtue of the fact that the cover layer 4 is only in contact with the second metallization layer 2 and does not project into the previously produced recess 8, the latter forms a free space 7. In this production method, therefore, a free space 7 is formed without a sacrificial layer specifically being applied for this purpose and subsequently having to be removed again. The cover layer 4 of the first metallization layer 5 can be laminated onto the second metallization layer 2, for example. In order that the cover layer 4 does not flow into the recess 8, so-called no-flow laminates, for example, can be used for the cover layer 4. Such no-flow laminates can be produced on the basis of resin or epoxide, for example. They can furthermore have, for reinforcement, a stabilizing fabric or else other reinforcing elements. One possible material that could be used for the cover layer 4, for example, is FR406NF from Isola. FIG. 10c illustrates an embodiment in which a cover layer 4 has been applied both on the top side and on the underside. This symmetrical construction ensures, for example, that strains do not occur in the circuit board. These strains can arise, for example, by the use of different materials for the circuit carrier 1 and the cover layer 4.

Figure 11A:
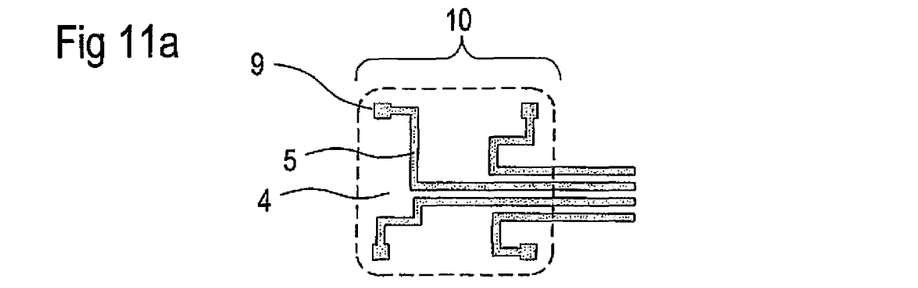
Figure 11B:
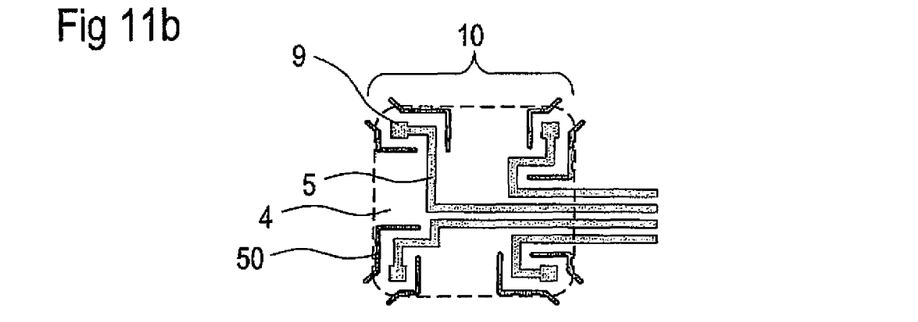
Figure 11C:
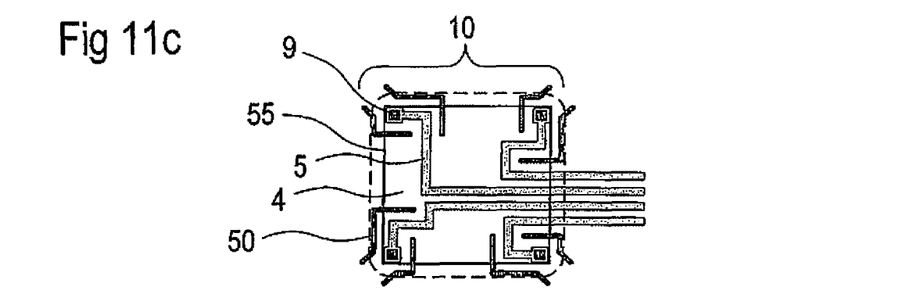
Figure 11D:
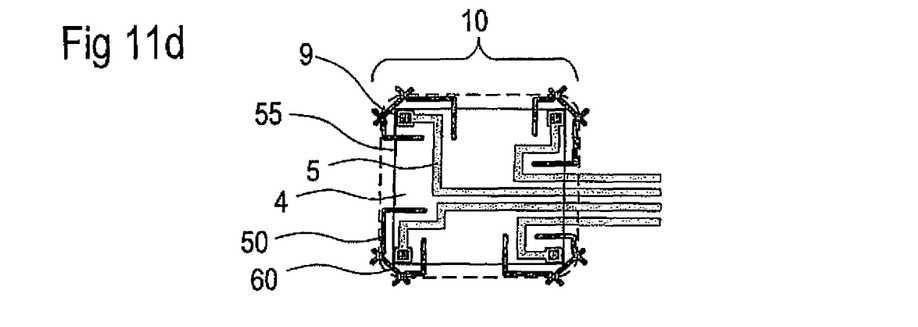

In FIGS. 11a to 11d, the flexible region 10 of a circuit board is in each case illustrated schematically in plan view for different process stages. FIG. 11a illustrates the flexible region 10 with the cover layer 4 and the first metallization layer 5 applied thereon. In this case, the first metallization layer 5 is shaped to form conductor tracks and contact areas 9. In FIG. 11b, the flexibility of the regions in which the contact areas 9 of the first metallization layer 5 are situated has been increased by means of cutouts 50. The cutouts 50 can be produced with the aid of a laser, for example. The flexibility of the cover layer 4 in the regions in which the contact areas are situated is still restricted here, however, since these partial regions are still respectively connected to the surroundings by means of the corners. This also imparts a certain stability to the already flexible partial regions. This now makes it possible, as illustrated in FIG. 11c, to place an electronic component 55 onto the flexible region 10 of the circuit board and to make electrical contact with it via the contact areas 9. A solder paste can also be used for this purpose, for example. For reasons of clarity, only the contour of the electronic component 55 is illustrated. As illustrated in FIG. 11d, after the placement of the electronic component 55, even further cutouts 60 are produced. By virtue of these further cutouts, the flexible regions in which the contact areas 9 are situated are now no longer linked to their surroundings by means of the corners. The flexibility of these partial regions has been significantly increased again by means of the additional cutouts 60. Consequently, the electronic component 55 is connected to the circuit board only via very flexible elements. By virtue of the cutouts 50 and 60, and also by virtue of the curved routing of the conductor tracks, the flexibility of the flexible region 10 with respect to tensile stress in the direction of the circuit board plane is additionally increased.

Preferred methods for making contact between the electronic component 55 and the contact areas 9 are soldering, conductive adhesive bonding, thermosonic bonding and thermocompression bonding with the aid of metallic connecting bumps (stud bumps). In this case, the first two methods mentioned can be carried out without any problems on the flexible contact areas 9. The last two methods mentioned are preferably employed as long as the flexible region 10 is still supported by the delamination layer 3, since considerable perpendicular forces act in this case.

Even further embodiments, not illustrated as figures, will be described below.

A circuit board can also comprise a circuit carrier 1 having flexible regions 10 on two opposite sides.

In a further embodiment, the circuit board additionally comprises a barrier layer arranged between the delamination layer 3 and the cover layer 4. Said barrier layer can comprise, for example, a resist or a metal. Such an additional barrier layer can prevent possible influences of the cover layer 4 during the curing thereof on the delamination layer 3.

In a further embodiment, a delamination layer 3 is shaped in the circuit board, but it is not removed again. By way of example, a material on which the cover layer 4 does not adhere can be used for the delamination layer 3 remaining in the circuit board. By way of example, fluorinated polymers such as PTFE can be used for this purpose. By virtue of the fact that there is no adhesion between the delamination layer 3 and the cover layer 4 arranged thereabove, the flexible region 10 can be moved away from the plane of the cover layer 4 in the direction facing away from the delamination layer 3. Furthermore, the flexible region can also yield to compressive stresses acting in the direction of the circuit board plane by means of bending or compression.

In a further embodiment, the flexible region 10 comprises only the first metallization layer 5 and no cover layer 4. However, the first metallization layer 5 can be stabilized by an additional layer on its top side. A corresponding contact area is situated below the first metallization layer 5, which contact area can be shaped in the second metallization layer 2, for example. The corresponding contact area is arranged in such a way that, upon the pressing-in of the flexible region 10, an electrically conductive contact can be produced between the first metallization layer 5 or the region embodied as contact area 9 and the corresponding contact area. Pushbutton switches, for example, can be produced in this way.

The flexible region 10 can also comprise a plurality of first metallization layers 5, which can be separated for example by a plurality of cover layers 4 lying between them. In this case, each first metallization layer 5 can be shaped differently. Consequently, by way of example, the four conductor tracks illustrated in FIG. 11 could be situated in four different planes.

There are component-circuit board combinations in which, at the present time, contact can be made with the components only by means of a bonding wire or some other flexible connection. The reason for this is that excessively high mechanical stresses would occur in the component in the case of a fixed connection, for example direct soldering of the component on the circuit board. The corresponding embodiment of the invention now also makes it possible to link such components to the circuit board by means of a rigid connection if contact points are situated on the circuit board in a flexible region. The flexible regions have the effect that no stresses occur in the applied component.

In embodiments in which the free space 7 is shaped as a cavity, in one particular embodiment the cavity is filled with a soft or gelatinous substance, such that the flexible region 10 that is pressed into the cavity is either stabilized or caused to rebound.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A circuit board comprising:
a circuit carrier;
a cover layer composed of a nonconductive material, comprising an organic substance, arranged on the circuit carrier; and
a first metallization layer at least partly arranged on the cover layer,
wherein the first metallization layer has a flexible region and the cover layer has first cutouts in the flexible region,
wherein the flexible region has a side via which the flexible region is connected to a region of the first metallization layer attached to the cover layer, and
wherein the side has second cutouts configured to increase the flexibility of the flexible region.

2. The circuit board according to claim 1,
wherein the cover layer is additionally flexible in the flexible region.

3. The circuit board according to claim 1, wherein the flexible region has at least one axis along which the flexible region can bend away relative to the rest of the circuit board.

4. The circuit board according to claim 3, wherein the flexible region can move about said axis both toward the rest of the circuit board and away from the latter.

5. The circuit board according to claim 1,
wherein the flexible region is connected to its surroundings at only one side.

6. The circuit board according to claim 1, wherein the flexible region is shaped as a tongue.

7. The circuit board according to claim 1, wherein the flexible region is arranged above a free space.

8. The circuit board according to claim 1, wherein the first metallization layer on the cover layer, in partial regions of the flexible region, is shaped as a conductive track and/or contact area.

9. The circuit board according to claim 1, wherein the cover layer comprises a stabilizing fabric.

10. The circuit board according to claim 1, wherein an electronic component is arranged on the flexible region, said electronic component being electrically conductively connected to the first metallization layer.

11. The circuit board according to claim 1, wherein the first and second cutouts are configured to increase the flexibility of the flexible region with respect to tensile stress in the direction of the circuit board plane.

12. The circuit board according to claim 1, wherein a cap is placed on the circuit board in such a way that an enclosed volume for housing a component is formed at least in partial regions.

13. The circuit board according to claim 1, wherein the circuit board is used as an interposer.

14. The circuit board according to claim 10, wherein the circuit board has a coefficient of linear thermal expansion with respect to the circuit board plane which is at least 4 ppm/K greater than that of the electronic component mounted on the circuit board.

15. The circuit board according to claim 6, further comprising a plurality of elements arranged on the cover layer and on the tongue, wherein the tongue is bent out of the plane of the cover layer to such an extent that the tongue is perpendicular to the cover layer, such that respective ones of the elements are directed in all three spatial directions, and wherein the elements are each configured to be at least one from the group consisting of direction-dependent sensors, indicators and actuators.

16. A method for producing a circuit board, comprising the steps of:
providing a circuit carrier;
applying a delamination layer to a spatially delimited partial region of the circuit carrier;
applying a layer sequence to the delamination layer and a partial region of the circuit carrier, comprising
a cover layer, comprising an organic material, arranged on the circuit carrier, and
a first metallization layer at least partly arranged on the cover layer;
structuring the cover layer and the first metallization layer wherein a flexible region of the first metallization layer is defined, the cover layer having first cutouts in the flexible region, wherein the flexible region has a side via which the flexible layer is connected to a region of the first metallization layer attached to the cover layer; and
providing, in the side, second cutouts, the second cutouts being configured to increase the flexibility of the flexible region.

17. The method according to claim 16, wherein the delamination layer is removed for forming the flexible region in a further method step.

18. The method according to claim 17, wherein, as the delamination layer, a sacrificial layer is applied and structured which is selected from soluble layer, selectively etchable layer, volatile or decomposable layer, evaporable layer and layer having a low melting point.

19. The method according to claim 16, wherein the delamination layer comprises polyvinyl alcohol, polyvinylpyrrolidone or a cellulose derivative.

20. A method for producing a circuit board, comprising the steps of:
providing a circuit carrier;
working a recess in the circuit carrier;
applying a layer sequence to the circuit carrier, such that the recess is covered but not filled, as a result of which a free space is formed, wherein the layer sequence comprises a cover layer, comprising an organic material, and a first metallization layer on the cover layer;
structuring the cover layer and the first metallization layer above the free space, such that a flexible region of the first metallization layer is formed, the cover layer having first cutouts in the flexible region, wherein the flexible region has a side via which the flexible layer is connected to a region of the first metallization layer attached to the cover layer; and
providing, in the side, second cutouts, the second cutouts being configured to increase the flexibility of the flexible region.

21. A circuit board comprising:
a circuit carrier;
a cover layer composed of a nonconductive material, comprising an organic substance, arranged on the circuit carrier; and
a first metallization layer at least partly arranged on the cover layer,
wherein the first metallization layer has a flexible region and the cover layer has first cutouts in the flexible region,
wherein the flexible region has a side via which the flexible region is connected to a region of the first metallization layer attached to the cover layer,
wherein the side has second cutouts configured to increase the flexibility of the flexible region, and wherein said first and second cutouts combine to lead into the flexible region both from free edges of the flexible region and from a side by which the flexible region is connected to its surroundings.

22. A circuit board comprising:

a circuit carrier;

a cover layer composed of a nonconductive material, comprising an organic substance, arranged on the circuit carrier; and a first metallization layer at least partly arranged on the cover layer, wherein the first metallization layer has a flexible region and the cover layer has first cutouts in the flexible region, wherein the flexible region has a side via which the flexible region is connected to a region of the first metallization layer attached to the cover layer, wherein the side has second cutouts configured to increase the flexibility of the flexible region, and wherein said first and second cutouts comprise holes having different geometries in the flexible region.

* * * * *

UNITED STATES PATENT AND TRADEMARK OFFICE
CERTIFICATE OF CORRECTION

PATENT NO.        : 9,035,189 B2
APPLICATION NO.   : 12/997867
DATED             : May 19, 2015
INVENTOR(S)       : Pahl et al.

Page 1 of 1

It is certified that error appears in the above-identified patent and that said Letters Patent is hereby corrected as shown below:

On the title page item [73], change "EPCOS AC" to --EPCOS AG--

Signed and Sealed this
Twelfth Day of July, 2016

Michelle K. Lee
*Director of the United States Patent and Trademark Office*